(12) United States Patent
Wagner

(10) Patent No.: US 7,378,833 B2
(45) Date of Patent: May 27, 2008

(54) SUPPLY VOLTAGE CHARACTERISTIC MEASUREMENT

(75) Inventor: Horst W. Wagner, Northborough, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/240,687

(22) Filed: Sep. 30, 2005

(65) Prior Publication Data

US 2007/0075701 A1 Apr. 5, 2007

(51) Int. Cl.
*G01R 23/175* (2006.01)

(52) U.S. Cl. .............................. 324/76.54; 324/76.11; 327/158

(58) Field of Classification Search ............. 324/76.11, 324/76.54
See application file for complete search history.

(56) References Cited

U.S. PATENT DOCUMENTS

| | | | |
|---|---|---|---|
| 4,164,648 A | | 8/1979 | Chu |
| 5,489,466 A | | 2/1996 | Inaba et al. |
| 5,590,341 A | * | 12/1996 | Matter ........................ 713/320 |
| 5,663,991 A | | 9/1997 | Kelkar et al. |
| 5,703,838 A | | 12/1997 | Gorbics et al. |
| 5,793,822 A | | 8/1998 | Anderson et al. |
| 6,295,315 B1 | | 9/2001 | Frisch et al. |
| 6,421,794 B1 | | 7/2002 | Chen et al. |
| 6,448,754 B1 | | 9/2002 | Ihs et al. |
| 6,657,467 B2 | * | 12/2003 | Seki et al. .................. 327/158 |
| 6,670,800 B2 | | 12/2003 | Beach et al. |
| 6,747,470 B2 | | 6/2004 | Muhtaroglu et al. |
| 6,777,921 B2 | | 8/2004 | Abdennadher et al. |
| 6,822,491 B1 | | 11/2004 | Glass |
| 6,836,872 B2 | | 12/2004 | Abdennadher |
| 6,868,534 B2 | | 3/2005 | Fattouh et al. |
| 2002/0190283 A1 | * | 12/2002 | Seno et al. ................. 257/275 |
| 2003/0112027 A1 | | 6/2003 | Muhtaroglu et al. |
| 2003/0141859 A1 | | 7/2003 | Abdennadher et al. |
| 2003/0177427 A1 | | 9/2003 | Fattouh et al. |
| 2003/0210028 A1 | | 11/2003 | Beach et al. |
| 2004/0060017 A1 | | 3/2004 | Abdennadher |
| 2004/0085085 A1 | | 5/2004 | Mahtaroglu et al. |
| 2004/0128591 A1 | | 7/2004 | Ihs et al. |

OTHER PUBLICATIONS

Abdennadher, Salem, et al., "Mixed Signal DFT/BIST Automation Using Behavioral Modeling", 2001 Southwest Symposium on Mixed-Signal Design (SSMSD), pp. 137-140 (Feb. 25-27, 2001).
Abdennadher, Salem, "Flow for Phase Locked Loop Mixed Signal Simulation and Characterization Using Behavioral Modeling", 2003 Southwest Symposium on Mixed-Signal Design (SSMSD), pp. 66-70 (Feb. 23-25, 2003).
Alon, Elad, et al., "Circuits and Techniques for High-Resolution Measurement of On-Chip Power Supply Noise", 2004 Symposium on VLSI Circuits, Digest of Technical Papers, pp. 102-105 (Jun. 17-19, 2004).

(Continued)

*Primary Examiner*—Vincent Q. Nguyen
(74) *Attorney, Agent, or Firm*—Erik Nordstrom

(57) ABSTRACT

For one disclosed embodiment, a delay is to receive signals and to delay received signals for an amount of time at least partially dependent on a supply voltage to generate delayed signals. Logic is to help measure a characteristic relating to the supply voltage based at least in part on the delayed signals. Other embodiments are also disclosed.

6 Claims, 7 Drawing Sheets

OTHER PUBLICATIONS

Alon, Elad, et al., "Circuits and Techniques for High-Resolution Measurement of On-Chip Power Supply Noise", IEEE Journal of Solid-State Circuits, vol. 40, No. 4, pp. 820-828 (Apr. 2005).

Arabi, Karim, et al., "Digital Oscillation-Test Method for Delay and Stuck-at Fault Testing of Digital Circuits", Proceedings of the International Test Conference, pp. 91-100 (Oct. 18-23, 1998).

Arabi, K., et al., "Dynamic Digital Integrated Circuit Testing Using Oscillation-Test Method", Electronics Letters, vol. 34, No. 8, pp. 762-764 (Apr. 16, 1998).

Desai, Utpal, et al., "Itanium Processor Clock Design", Proceedings of the 2000 International Symposium on Physical Design (ISPD), pp. 94-98 (May 2000).

Dufaza, C., et al., "Boolean Equations for Multiple Paths Sensitisation of Digital Oscillation Built-In Self Test", Electronics Letters, vol. 34, No. 23, pp. 2213-2215 (Nov. 12, 1998).

Fischer, Tim, et al., "A 90nm Variable-Frequency Clock System for a Power-Managed Itanium-Family Processor", 2005 IEEE International Solid-State Circuits Conference (ISSCC), Digest of Technical Papers, vol. 1, pp. 294-295 & 599 (Feb. 6-10, 2005).

Muhtaroglu, Ali, et al., "On-Die Droop Detector for Analog Sensing of Power Supply Noise", 2003 Symposium on VLSI Circuits, Digest of Technical Papers, pp. 193-196 (Jun. 12-14, 2003).

Muhtaroglu, Ali, et al., "On-Die Droop Detector for Analog Sensing of Power Supply Noise", IEEE Journal of Solid-State Circuits, vol. 39, No. 4, pp. 651-660 (Apr. 2004).

Sunter, Stephen, et al., "BIST for Phase-Locked Loops in Digital Applications", Proceedings of the International Test Conference, pp. 532-540 (Sep. 28-30, 1999).

Sunter, Stephen, et al., "On-Chip Digital Jitter Measurement, from Megahertz to Gigahertz", IEEE Design & Test of Computers, vol. 21, No. 4, pp. 314-321 (Jul.-Aug. 2004).

Takamiya, Makoto, et al., "An On-chip 100GHz-Sampling Rate 8-channel Sampling Oscilloscope with Embedded Sampling Clock Generator", 2002 IEEE International Solid-State Circuits Conference (ISSCC), Digest of Technical Papers, vol. 1, pp. 182-183 & 458 (Feb. 3-7, 2002).

Takamiya, Makoto, et al., "An On-Chip 100GHz-Sampling 8-channel Sampling Oscilloscope with Embedded Sampling Clock Generator", 2002 IEEE International Solid-State Circuits Conference (ISSCC), Digest of Technical Papers, vol. 2, pp. 140-141 & 439 (Feb. 3-7, 2002).

Takamiya, Makoto, et al., "On-Chip Jitter-Spectrum-Analyzer for High-Speed Digital Designs", 2004 IEEE International Solid-State Circuits Conference (ISSCC), Digest of Technical Papers, vol. 1, pp. 350-532 (Feb. 15-19, 2004).

* cited by examiner

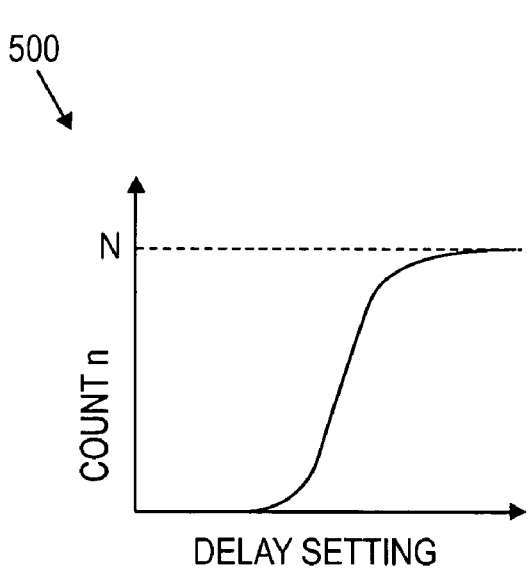
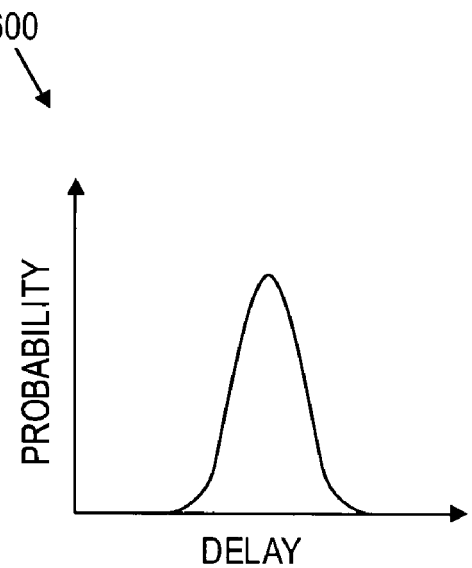
FIG. 5
FIG. 6
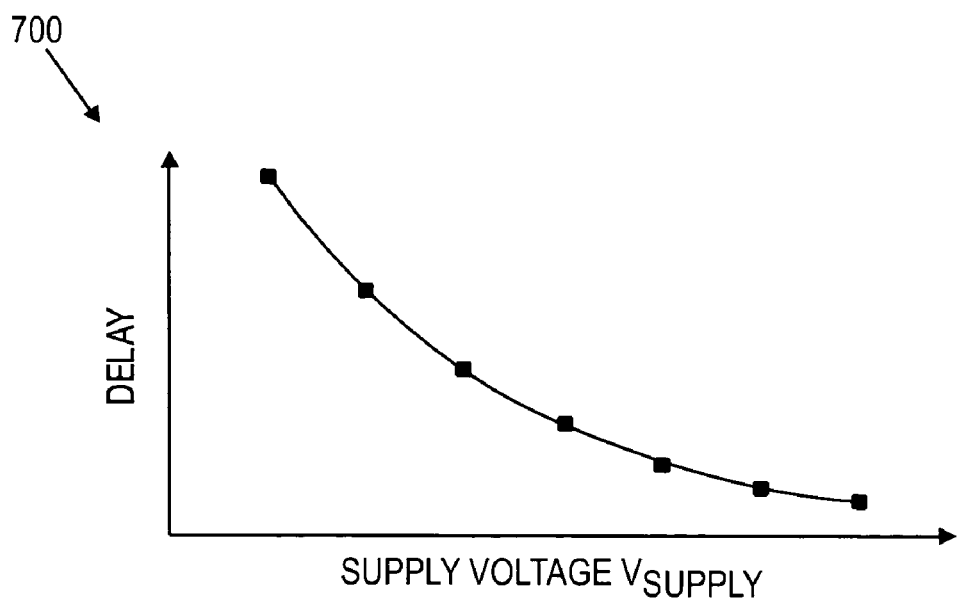
FIG. 7

SUPPLY VOLTAGE CHARACTERISTIC MEASUREMENT

FIELD

Embodiments described herein generally relate to power monitoring.

BACKGROUND

With trends toward using lower power supply voltages on integrated circuits, power supply noise is of increasing concern. Power supply noise can, for example, induce jitter which can reduce effective cycle time for processors and/or reduce maximum bandwidth on input/output (I/O) links. Because modeling of power supply noise is prone to uncertainties, measuring power supply noise is desirable.

BRIEF DESCRIPTION OF THE DRAWINGS

Embodiments are illustrated by way of example and not limitation in the figures of the accompanying drawings, in which like references indicate similar elements and in which:

FIG. 5 illustrates, for one embodiment, an example graph of counts for different delay settings using logic of FIG. 2;

FIG. 6 illustrates, for one embodiment, an example graph of probabilities for different delays using logic of FIG. 2;

FIG. 7 illustrates, for one embodiment, an example graph of a transfer curve to transform delays of FIG. 6 to supply voltages;

The figures of the drawings are not necessarily drawn to scale.

DETAILED DESCRIPTION

The following detailed description sets forth example embodiments of apparatuses, methods, mediums, and systems relating to supply voltage characteristic measurement. Features, such as structure(s), function(s), and/or characteristic(s) for example, are described with reference to one embodiment as a matter of convenience; various embodiments may be implemented with any suitable one or more described features.

Figure 1:
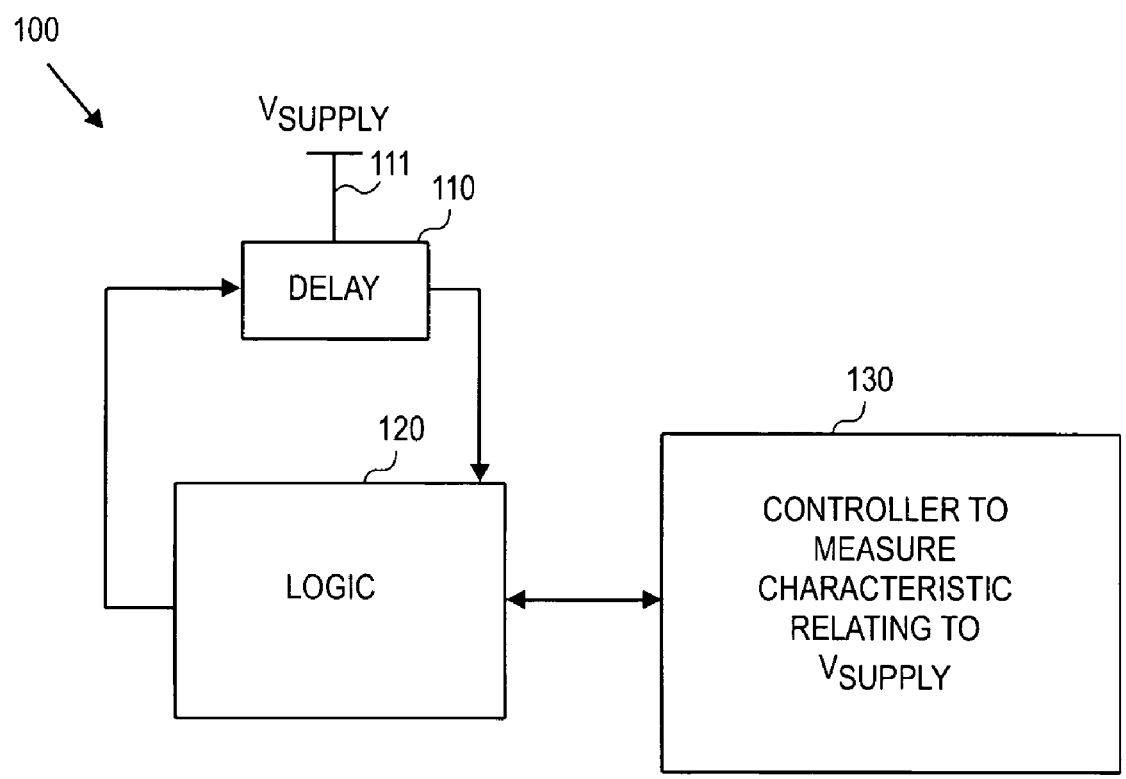
FIG. 1 illustrates, for one embodiment, a block diagram of an apparatus to measure a characteristic relating to a supply voltage.

FIG. 1 illustrates, for one embodiment, an apparatus 100 to measure a characteristic relating to a supply voltage. As illustrated in FIG. 1, apparatus 100 for one embodiment may comprise a delay 110, logic 120, and a controller 130. Delay 110 for one embodiment may be coupled to receive a supply voltage $V_{supply}$ at a supply node 111 and delay signals for an amount of time at least partially dependent on the supply voltage $V_{supply}$ to generate delayed signals. Delay 110 for one embodiment may be coupled to receive signals from logic 120 and delay such received signals. Logic 120 for one embodiment may be coupled to receive the delayed signals to help measure a characteristic relating to the supply voltage $V_{supply}$ based at least in part on the delayed signals. Controller 130 for one embodiment may be coupled to control logic 120 to measure the characteristic relating to the supply voltage $V_{supply}$.

Controller 130 for one embodiment may control logic 120 to measure any suitable characteristic relating to the supply voltage $V_{supply}$. Controller 130 for one embodiment may control logic 120 to measure a probability that the delay of signals by delay 110 is approximately at one or more values. Controller 130 for one embodiment may be coupled to control logic 120 to measure a probability that the supply voltage $V_{supply}$ is approximately at one or more values. Controller 130 for one embodiment may be coupled to control logic 120 to measure an approximate average value for the delay of delay 110. Controller 130 for one embodiment may be coupled to control logic 120 to measure an approximate average value for the supply voltage $V_{supply}$.

The measured characteristic relating to the supply voltage $V_{supply}$ may be used for any suitable purpose. The measured characteristic for one embodiment may be used, for example, to help confirm modeling of noise in the supply voltage $V_{supply}$. The measured characteristic for one embodiment may be used, for example, to help debug potential supply voltage $V_{supply}$ noise induced failures.

LOGIC TO HELP MEASURE SUPPLY VOLTAGE CHARACTERISTIC

Figure 2:
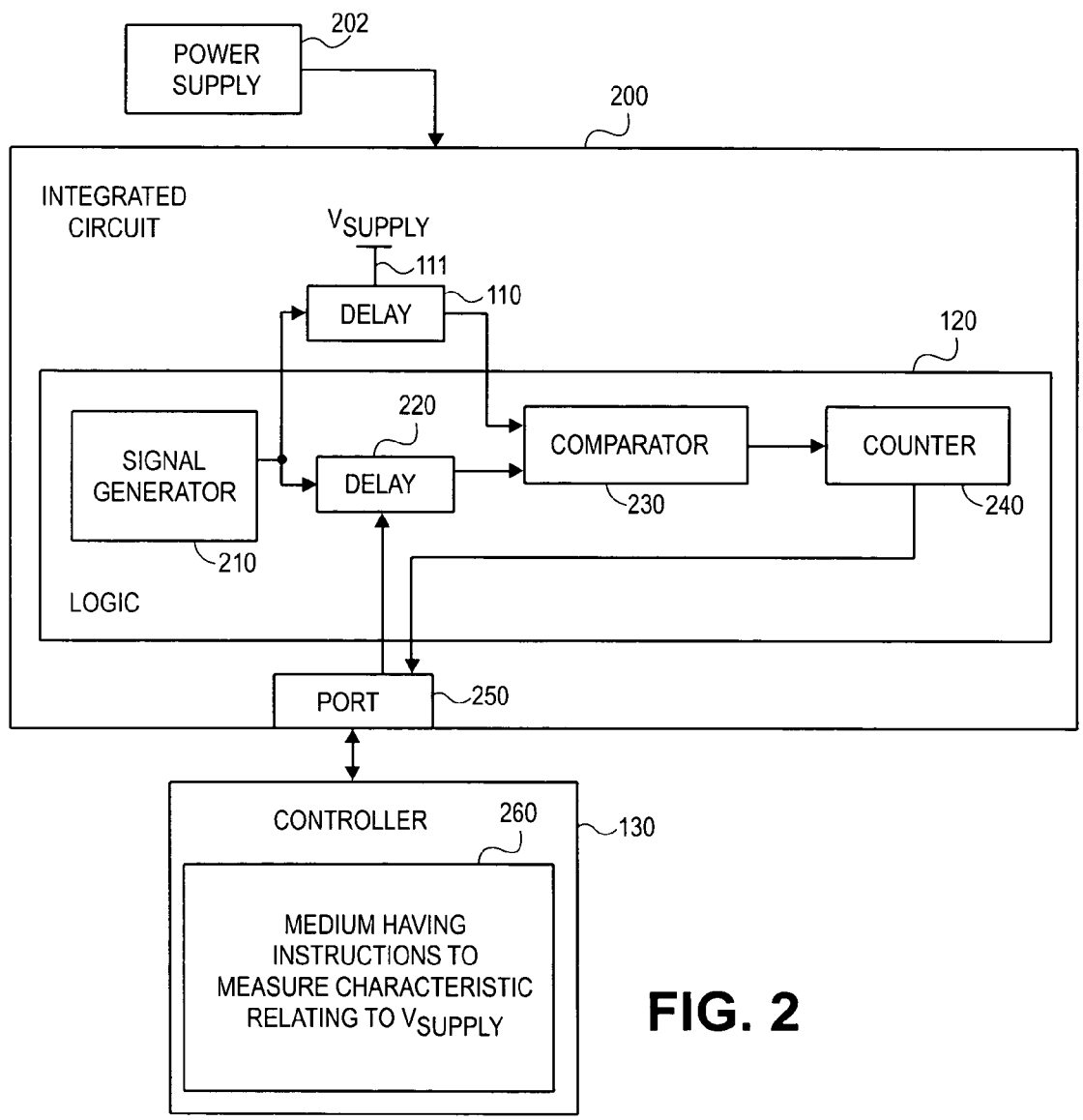
FIG. 2 illustrates, for one embodiment, a block diagram of logic for an apparatus to help measure a characteristic relating to a supply voltage on an integrated circuit.

Logic 120 may be implemented in any suitable manner. Logic 120 for one embodiment, as illustrated in FIG. 2, may comprise a delay 220 and a comparator 230. Delay 220 for one embodiment may delay signals for a controllable amount of time to generate delayed signals. Comparator 230 for one embodiment may compare delayed signals from delay 110 and delayed signals from delay 220.

Comparator 230 for one embodiment may generate results based on comparisons of delayed signals from delay 110 and delayed signals from delay 220. Comparator 230 for one embodiment may generate one or more signals corresponding to a first result if a delayed signal from delay 110 is detected earlier than a delayed signal from delay 220. Comparator 230 for one embodiment may generate one or more signals corresponding to a second result if a delayed signal from delay 110 is detected later than a delayed signal from delay 220. Comparator 230 for one embodiment may generate a result signal representative of a bit having a first binary value corresponding to the first result and a second binary value corresponding to the second result.

Logic 120 for one embodiment, as illustrated in FIG. 2, may comprise a signal generator 210 to generate any suitable signals. For one embodiment, as illustrated in FIG. 2, both delay 110 and delay 220 may be coupled to receive common signals from signal generator 210. Comparator 230 for one embodiment may therefore compare delayed signals generated from a common signal from signal generator 210 to generate a result that identifies whether delay 110 or delay 220 delayed the common signal longer. Signal generator 210 for one embodiment may generate a clock signal to be delayed by delay 110 and delay 220.

Controller 130 for one embodiment may control delay 220 and identify one or more results from comparator 230 to help measure delay of signals by delay 110. Because the delay of signals by delay 110 may be at least partially dependent on the supply voltage $V_{supply}$, controller 130 for one embodiment may measure a characteristic relating to the supply voltage $V_{supply}$ based on one or more results from comparator 230.

Controller 130 for one embodiment may set a delay setting of delay 220 to delay signals for an amount of time based on the delay setting and identify one or more results from comparator 230 for that delay setting. Controller 130 for one embodiment may then identify result(s) from comparator 230 for different delay settings to help measure delay of signals by delay 110. Controller 130 for one embodiment may identify result(s) from comparator 230 for different delay settings to measure a probability that the delay of signals by delay 110 is in an interval of two values and therefore measure a probability that the delay of signals by delay 110 is approximately at one or more values.

Logic 120 for one embodiment, as illustrated in FIG. 2, may comprise a counter 240 coupled to count predetermined results of comparisons by comparator 230. Counter 240 for one embodiment may count from comparator 230 first result(s) from when a delayed signal from delay 110 is detected earlier than a delayed signal from delay 220. Counter 240 for one embodiment may count from comparator 230 second result(s) from when a delayed signal from delay 110 is detected later than a delayed signal from delay 220. Controller 130 for one embodiment may be coupled to identify a count of predetermined results from counter 240 to identify result(s) from comparator 230. Controller 130 for one embodiment may be coupled to read or otherwise receive the count from counter 240.

Delay 110 and logic 120 for one embodiment, as illustrated in FIG. 2, may be integrated on an integrated circuit 200 to help measure a characteristic relating to a supply voltage on integrated circuit 200. Although described and illustrated in connection with one delay 110 and logic 120, integrated circuit 200 for one embodiment may comprise multiple delays similar to delay 110 and/or multiple components of logic similar to logic 120 to help measure a characteristic relating to one or more supply voltages at multiple locations on integrated circuit 200.

Integrated circuit 200 for one embodiment may be coupled to receive power from a power supply 202 to generate the supply voltage $V_{supply}$ at supply node 111. Power supply 202 for one embodiment may comprise a battery. Power supply 202 for one embodiment may comprise an alternating current to direct current (AC-DC) converter. Power supply 202 for one embodiment may comprise a DC-DC converter. Power supply 202 for one embodiment may comprise one or more voltage regulators to help supply power to integrated circuit 200.

Integrated circuit 200 for one embodiment may receive the supply voltage $V_{supply}$ at supply node 111 directly from power supply 202. Integrated circuit 200 for one embodiment may receive an input supply voltage from power supply 202 and generate the supply voltage $V_{supply}$ at supply node 111 from the received input supply voltage using one or more voltage regulators on integrated circuit 200.

Integrated circuit 200 for one embodiment may comprise a port 250 to help allow controller 130 to control logic 120. Integrated circuit 200 may comprise any suitable port 250 through which controller 130 may be coupled to control logic 120. Port 250 for one embodiment may comprise at least a portion of any suitable test access port (TAP). Port 250 for one embodiment may comprise at least a portion of a joint test access group (JTAG) port. For one embodiment where logic 120 comprises delay 220, comparator 230, and counter 240, as illustrated in FIG. 2, port 250 may help allow controller 130 to at least control delay 220 and identify a count from counter 240.

Although all of logic 120 is illustrated as being integrated on integrated circuit 200, at least a portion of logic 120 for one embodiment may be external to integrated circuit 200. As one example, signal generator 210 may be external to integrated circuit 200. Signal generator 210 for one embodiment may optionally form a portion of controller 130.

Although illustrated in FIG. 2 as being external to integrated circuit 200, at least a portion or all of controller 130 for one embodiment may be integrated on integrated circuit 200.

EXAMPLE CIRCUITRY

Delay 110 and logic 120 may be implemented using any suitable circuitry.

Delay 110 may be implemented using any suitable supply voltage sensitive delay circuitry. Delay 110 may be implemented using any suitable delay circuitry that may or may not have a generally linear characteristic with respect to delay.

Figure 3:
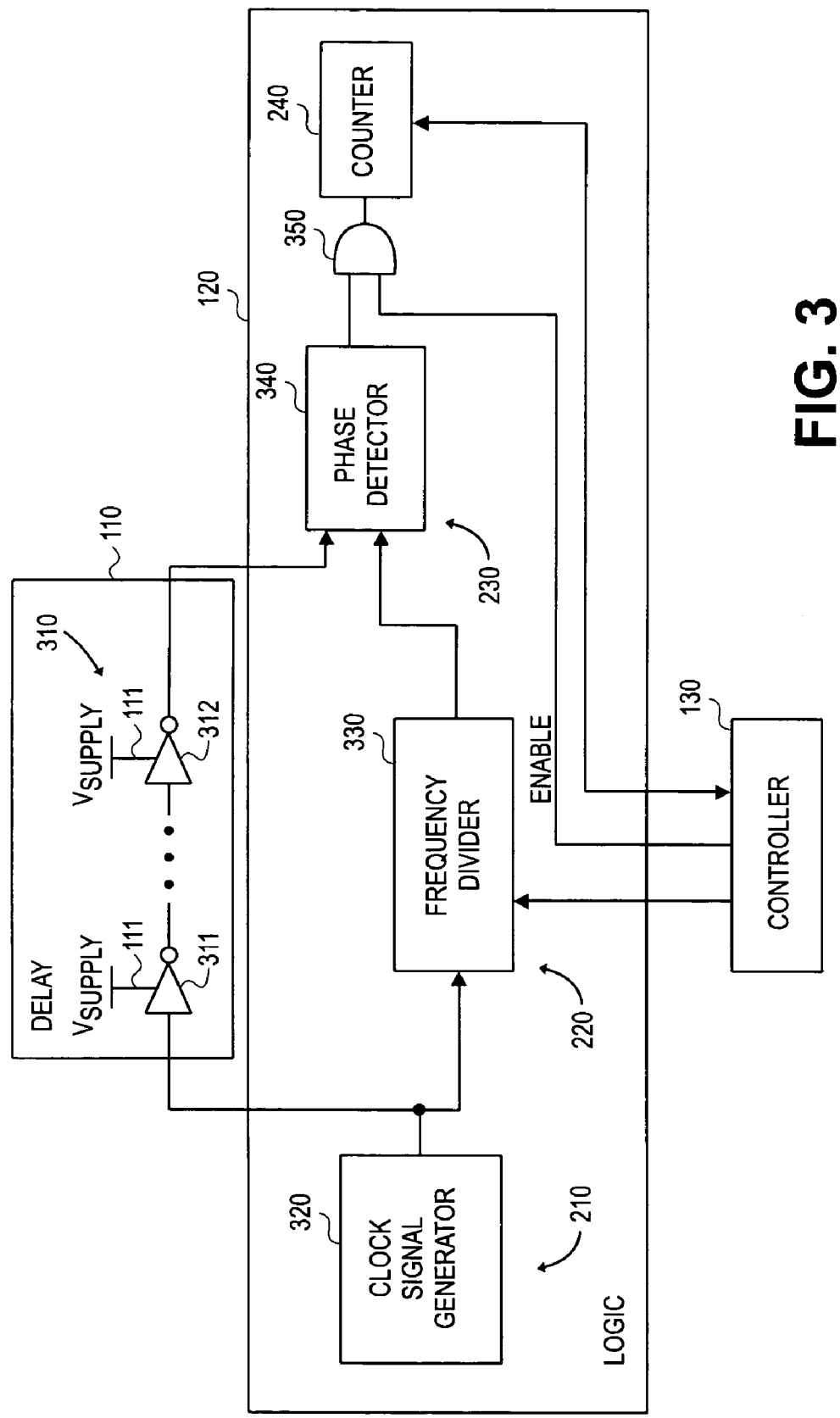
FIG. 3 illustrates, for one embodiment, example circuitry to implement logic of FIG. 2.

Delay 110 for one embodiment, as illustrated in FIG. 3, may be implemented using any suitable number of one or more buffers, such as inverting buffers 310 for example, coupled to receive the supply voltage $V_{supply}$ at supply node 111. For one embodiment, a plurality of inverting buffers 310 may be coupled to form an inverter chain to propagate a signal received at an input of a first inverting buffer 311 through any suitable number of intermediate inverting buffer(s), if any, to an output of a last inverting buffer 312.

Signal generator 210 may be implemented using any suitable circuitry. Signal generator 210 for one embodiment, as illustrated in FIG. 3, may comprise circuitry to implement a clock signal generator 320 to generate a clock signal of any suitable frequency and duty cycle. Clock signal generator 320 for one embodiment may comprise a phase lock loop (PLL), for example.

Delay 220 may be implemented using any suitable delay circuitry. Delay 220 for one embodiment may be implemented using delay circuitry having a relatively high power supply rejection ratio (PSRR). Delay 220 may be implemented using any suitable delay circuitry that may or may not have a generally linear characteristic with respect to delay.

For one embodiment where delay 220 is coupled to receive a clock signal, delay 220 for one embodiment, as illustrated in FIG. 3, may be implemented using a frequency divider 330. Frequency divider 330 for one embodiment may be selectively controlled to generate an output signal having substantially the same frequency as the received clock signal and having any suitable phase shifted relative to the received clock signal in accordance with a delay setting. Frequency divider 330 for one embodiment may be a digital frequency divider.

Comparator 230 may be implemented using any suitable circuitry. Comparator 230 for one embodiment, as illustrated in FIG. 3, may be implemented using a phase detector 340.

Although illustrated in FIG. 3 as having inverting buffers 310, clock signal generator 320, frequency divider 330, and phase detector 340 in one embodiment, one or more other embodiments may or may not use inverting buffers 310, clock signal generator 320, frequency divider 330, and/or phase detector 340.

Logic 120 for one embodiment may also comprise any suitable enablement circuitry to enable and disable any suitable one or more components of logic 120.

Logic 120 for one embodiment may comprise an AND gate 350 coupled to perform a logical AND operation on a result signal from comparator 230 and an enable signal and to generate an output signal for counter 240 to count results. The enable signal for one embodiment may then be deactivated, that is changed to be representative of a binary zero value, to disable counter 240 from receiving result signals from comparator 230 and therefore cease counting. AND gate 350 may be implemented using any suitable circuitry.

Logic 120 for one embodiment may similarly comprise one or more AND gates to disable delay 110 and/or delay 220 from receiving signals, comparator 230 from receiving delayed signals from delay 110, and/or comparator 230 from receiving delayed signals from delay 220.

Although described as using an AND gate, logic 120 for one embodiment may use alternative logic to enable and disable one or more components of logic 120.

One or more components of logic 120 for one embodiment may be directly enabled and disabled in response to activation and deactivation, respectively, of an enable signal. A component of logic 120 for one embodiment may then be directly enabled and disabled in addition to or instead of having receipt of input signals enabled and disabled.

Controller 130 for one embodiment may be coupled to activate and deactivate one or more enable signals to enable and disable any suitable one or more components of logic 120 selectively. Controller 130 for one embodiment may be coupled to reset counter 240 selectively.

EXAMPLE OPERATION

Controller 130 may comprise any suitable logic to control logic 120 in any suitable manner. Controller 130 for one embodiment may control logic 120 in accordance with a flow diagram 400 of FIG. 4.

Figure 4:
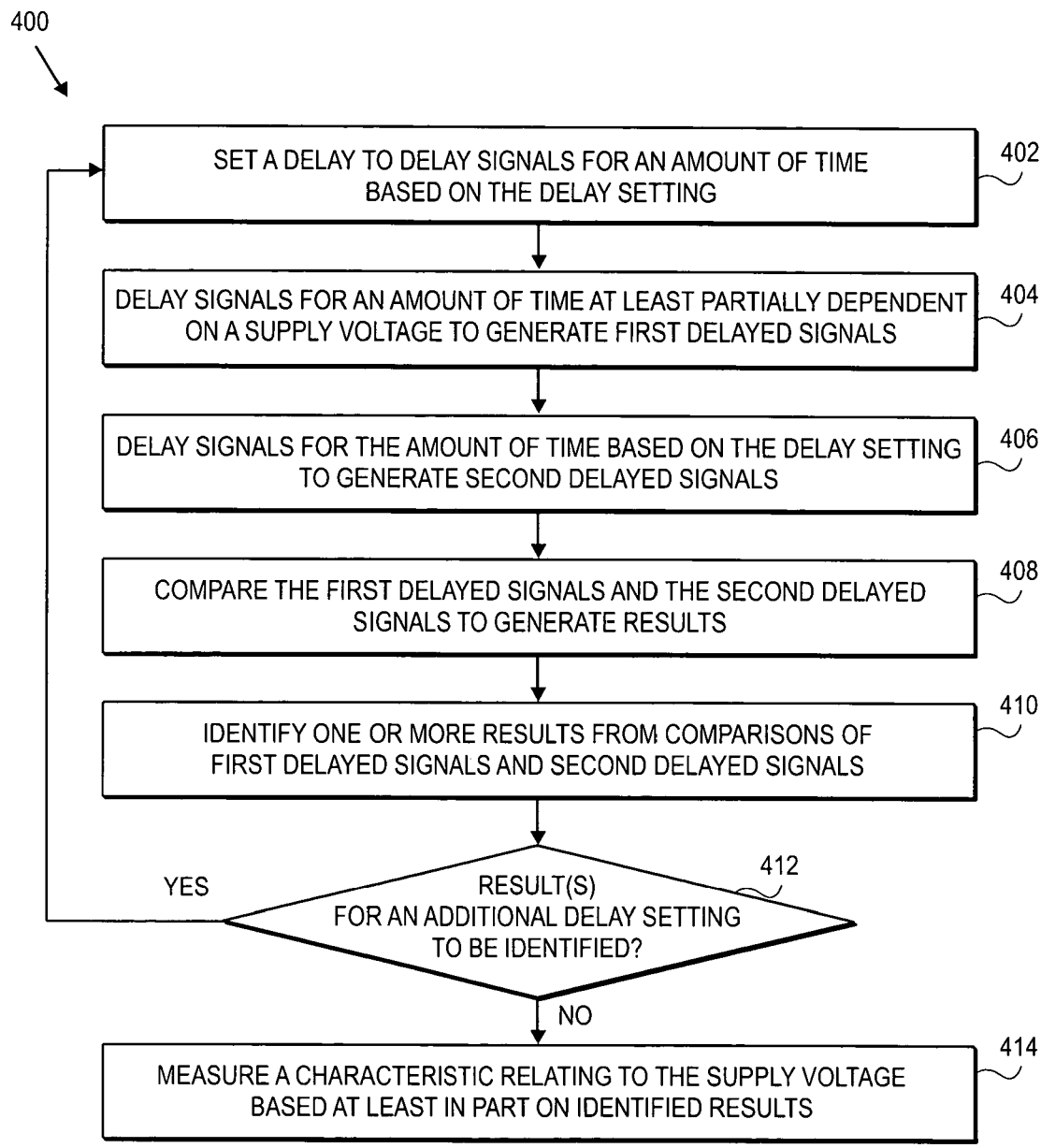
FIG. 4 illustrates, for one embodiment, a flow diagram that may be performed using logic of FIG. 2.

As illustrated in FIG. 4, controller 130 for block 402 may set delay 220 to delay signals for an amount of time based on the delay setting. Controller 130 for one embodiment may initially set delay 220 to delay signals for a predetermined initial amount of time. Controller 130 for one embodiment may activate one or more enable signals to enable counting of results.

For block 404, delay 110 may delay signals for an amount of time at least partially dependent on the supply voltage $V_{supply}$ to generate first delayed signals. For block 406, delay 220 may delay signals for the amount of time based on the delay setting to generate second delayed signals. For block 408, comparator 230 may compare the first delayed signals and the second delayed signals to generate results.

For block 410, controller 130 may identify one or more results from comparisons of first delayed signals and second delayed signals. Controller 130 for one embodiment may identify one or more predetermined results from comparisons of first delayed signals and second delayed signals. Controller 130 for one embodiment may identify one or more predetermined results from comparisons of a predetermined number N of pairs of first and second delayed signals.

For one embodiment for block 410, counter 240 may count predetermined results from comparator 230, and controller 130 may identify the count n of predetermined results. Controller 130 for one embodiment may deactivate one or more enable signals to disable counting of results after comparator 230 has compared a predetermined number N of pairs of first and second delayed signals. Controller 130 for one embodiment may deactivate one or more enable signals after activation of such enable signal(s) for a predetermined period of time corresponding to the comparison of a predetermined number N of pairs of first and second delayed signals. The predetermined number N may be any suitable integer value greater than one, and the count n may be an integer value less than or equal to N. The predetermined number N for one embodiment may be a variable set by controller 130 and/or a user of controller 130. Controller 130 for one embodiment may reset counter 240 after identifying the count n to prepare for another count of results.

If, for block 412, result(s) for an additional delay setting are to be identified, operations for blocks 402, 404, 406, 408, 410, and 412 may be repeated to identify one or more results from comparisons of first delayed signals and second delayed signals for a different delay setting for delay 220. Controller 130 for one or more subsequent iterations for block 402 may set any suitable different delay setting for delay 220 in any suitable manner.

Controller 130 for one embodiment may initially set delay 220 to delay signals for a predetermined minimum amount of time and increase the delay setting for one or more subsequent iterations for block 402. Controller 130 for one embodiment may initially set delay 220 to delay signals for a predetermined maximum amount of time and decrease the delay setting for one or more subsequent iterations for block 402.

Controller 130 for one embodiment for block 402 may adjust a current delay setting for delay 220 by any suitable amount of time to identify a new delay setting for delay 220. Controller 130 for one embodiment for block 402 may adjust a current delay setting for delay 220 by a predetermined amount of time. Controller 130 for one embodiment for block 402 may adjust a current delay setting for delay 220 by the same predetermined amount of time for one or more iterations for block 402.

Operations for blocks 402-412 may be repeated any suitable number of one or more times until no more results are to be identified for any additional delay setting for block 412.

Operations for blocks 402-412 for one embodiment may be repeated a predetermined number of time(s). Such a predetermined number of time(s) for one embodiment may be a variable set by controller 130 and/or a user of controller 130.

Operations for blocks 402-412 for one embodiment may be repeated until the delay setting set for block 402 satisfies any suitable one or more conditions. Operations for blocks 402-412 for one embodiment may be repeated until result(s) are identified for a delay setting to delay signals for greater than, or greater than or equal to, a predetermined end amount of time. Operations for blocks 402-412 for one embodiment may be repeated until result(s) are identified for a delay setting to delay signals for less than, or less than or equal to, a predetermined end amount of time.

Operations for blocks 402-412 for one embodiment may be repeated until a predetermined number or percentage of result(s) identified for a delay setting satisfy one or more conditions. Operations for blocks 402-412 for one embodiment may be repeated until at least a predetermined number or percentage of result(s) identified for a delay setting identify that the delay of delay 220 is longer than the delay of delay 110. Operations for blocks 402-412 for one embodiment may be repeated until at least a predetermined number or percentage of result(s) identified for a delay setting identify that the delay of delay 110 is longer than the delay of delay 220.

For block 414, controller 130 may measure a characteristic relating to the supply voltage $V_{supply}$ based at least in part on identified results. Controller 130 may measure any suitable characteristic relating to the supply voltage $V_{supply}$ based at least in part on identified results in any suitable manner.

Controller 130 for one embodiment may measure a probability that the delay of signals by delay 110 is approximately at one or more values based at least in part on identified results. Controller 130 for one embodiment may measure a probability that the delay of signals by delay 110 is in an interval of two values based at least in part on identified results. Controller 130 for one embodiment may measure an approximate average value for the delay of delay 110 based at least in part on identified results. Controller 130 for one embodiment may measure an approximate average interval of values for the delay of delay 110 based at least in part on identified results.

Controller 130 for one embodiment may measure a probability that the supply voltage $V_{supply}$ is approximately at one or more values based at least in part on identified results. Controller 130 for one embodiment may measure an approximate average value for the supply voltage $V_{supply}$ based at least in part on identified results.

For one embodiment where controller 130 may identify a count n of predetermined results for different delay settings, controller 130 may identify count n as a function of delay setting and differentiate such data to identify a probability that the supply voltage $V_{supply}$ is such that the delay of delay 110 satisfies one or more predetermined relationships with the delay of delay 220 for different delay settings. Controller 130 for one embodiment may identify, for example, a probability that the supply voltage $V_{supply}$ is such that the delay of delay 110 is in an interval of two delay values corresponding to two delay settings. Controller 130 for one embodiment may therefore identify a probability that the delay of signals by delay 110 is approximately at one or more values.

FIG. 5 illustrates, for one embodiment, an example graph 500 of count n as a function of delay setting for delay 220. Graph 500 may result, for example, from counting for different delay settings for delay 220 predetermined results identifying when a delayed signal from delay 110 is detected earlier than a delayed signal from delay 220.

FIG. 6 illustrates, for one embodiment, an example graph 600 of probabilities for different delays of delay 110. Graph 600 may result, for example, by normalizing data for graph 500 to the number of pairs of first and second delayed signals compared for a given delay setting and differentiating the normalized data.

Controller 130 for one embodiment may identify an approximate average value for the delay of delay 110 based on measured probabilities that the delay of signals by delay 110 is at different values. Controller 130 for one embodiment may identify an approximate average interval of values for the delay of delay 110 based on measured probabilities that the delay of signals by delay 110 is in different intervals of delay values. Where the distribution of probabilities is symmetrical or substantially symmetrical, the center of the distribution generally corresponds to an approximate average value or approximate average interval of values. The average delay value or average interval of delay values generally correspond to an average value for the supply voltage $V_{supply}$. The width of the distribution corresponds to a measure for noise amplitude and likelihood of excursion for the supply voltage $V_{supply}$.

Controller 130 for one embodiment may transform probabilities for different delays for delay 110 into probabilities that the supply voltage $V_{supply}$ is approximately at particular values. Controller 130 for one embodiment may generate calibration data beforehand by performing operations for blocks 402-414 using different known, relatively stable supply voltages. Controller 130 for one embodiment may generate calibration data in a controlled, relatively inactive environment. Controller 130 for one embodiment may generate calibration data by identifying a correspondence between delays and supply voltages. Controller 130 for one embodiment may then transform probabilities for delays into probabilities for supply voltages using such calibration data.

Controller 130 for one embodiment may identify a correspondence between a delay setting and a supply voltage to generate calibration data. Controller 130 for one embodiment may identify a correspondence between an approximate average delay for a delay setting and a supply voltage to generate calibration data. Controller 130 for one embodiment may identify a correspondence between an interval of delay values and a supply voltage to generate calibration data. Controller 130 for one embodiment may identify a correspondence between an approximate average delay for an interval of delay values and a supply voltage to generate calibration data.

FIG. 7 illustrates, for one embodiment, an example graph 700 of a transfer curve to transform delays, such as those of FIG. 6 for example, to supply voltages. Transforming delays to supply voltages for one embodiment may help allow use of delay 110 and/or delay 220 without a generally linear characteristic with respect to delay.

Controller 130 for one embodiment may identify an approximate average value for the supply voltage $V_{supply}$ based on measured probabilities that the supply voltage $V_{supply}$ is at different values. Controller 130 for one embodiment may identify an approximate average value for the supply voltage $V_{supply}$ by transforming an approximate average value for the delay of delay 110 using calibration data. Controller 130 for one embodiment may identify an approximate average value for the supply voltage $V_{supply}$ by transforming an approximate average interval of values for the delay of delay 110 using calibration data.

Controller 130 for one embodiment may perform instructions to perform and/or repeat operations for blocks 402, 410, and/or 414. Such instructions may be stored and/or embedded on any suitable medium which may be accessed to perform such instructions. Controller 130 for one embodiment, as illustrated in FIG. 2, may comprise such a medium 260. Controller 130 for one embodiment may be coupled to receive instructions from such a medium.

Operations for blocks 402-414 may be performed in any suitable order and may or may not overlap in time with the performance of any other suitable operation. As one example, first and second delayed signals may be compared for block 408 as other signals are delayed for blocks 404 and 406.

EXAMPLE OPERATION FOR PATTERN DEPENDENT NOISE

Operations for blocks 402-414 for one embodiment may be performed to measure a characteristic relating to a supply voltage $V_{supply}$ having pattern dependent noise. Controller 130 for one embodiment may control logic 120 to measure a characteristic relating to a supply voltage $V_{supply}$ during one or more portions of a predetermined pattern of activity on integrated circuit 200, for example.

Controller 130 for one embodiment may selectively enable one or more components of logic 120 to identify results from comparisons of delayed signals during a first portion of multiple performances of a predetermined pattern of activity to measure a characteristic relating to a supply voltage $V_{supply}$ during that first portion. Controller 130 for one embodiment may then selectively enable one or more components of logic 120 to identify results from comparisons of delayed signals during a second portion of multiple performances of the predetermined pattern of activity to measure a characteristic relating to the supply voltage $V_{supply}$ during that second portion. Controller 130 may similarly measure a characteristic relating to the supply voltage $V_{supply}$ during other portions.

Figure 8:
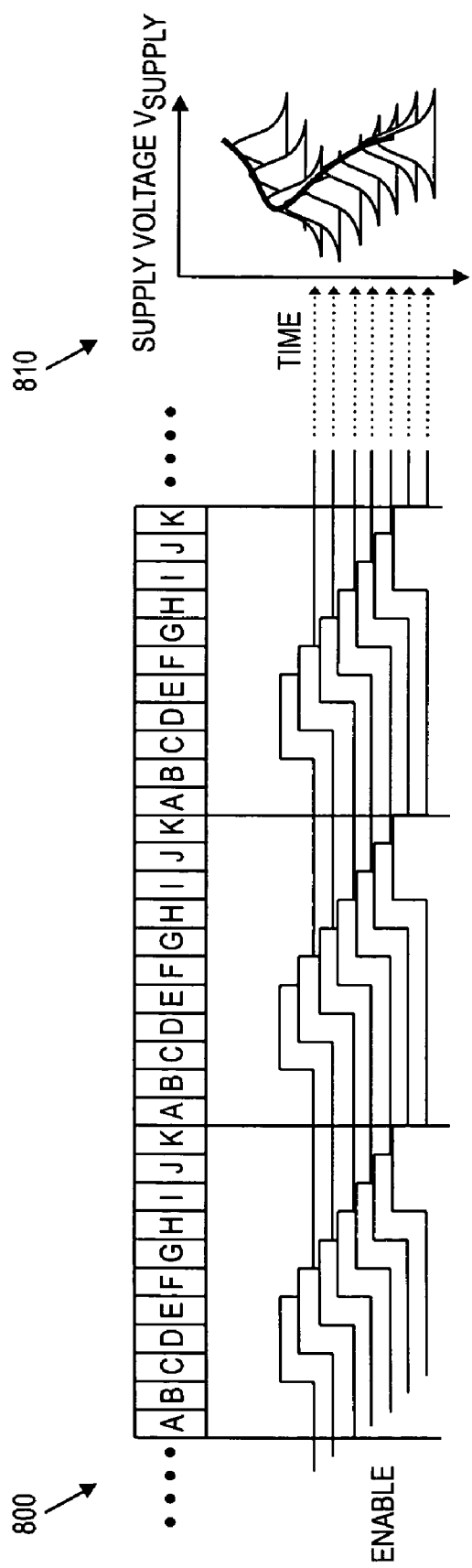
FIG. 8 illustrates, for one embodiment, an example diagram illustrating how a characteristic relating to a supply voltage having pattern dependent noise may be measured.

FIG. 8 illustrates, for one embodiment, an example diagram 800 illustrating how a characteristic relating to a supply voltage $V_{supply}$ during different portions of an example pattern of activity ABCDEFGHIJK may be measured. As illustrated in FIG. 8, controller 130 may activate an enable signal to enable one or more components of logic 120 during a portion CDE of the activity pattern to identify one or more results from comparisons of delayed signals for one delay setting. As the same activity pattern is repeatedly performed, controller 130 may then repeat activating an enable signal to enable one or more components of logic 120 during the same portion CDE of the activity pattern to identify one or more results from comparisons of delayed signals for other delay settings. Controller 130 may then measure a characteristic relating to the supply voltage $V_{supply}$ during the CDE portion.

Controller 130 may then similarly activate an enable signal to enable one or more components of logic 120 during, for example, a portion DEF for different delay settings as the activity pattern is repeatedly performed to measure a characteristic relating to the supply voltage $V_{supply}$ during the DEF portion. Controller 130 may similarly measure a characteristic relating to the supply voltage $V_{supply}$ during other portions such as, for example, EFG, FGH, GHI, HIJ, and IJK.

An example graph 810 that may result from measuring a characteristic relating to the supply voltage $V_{supply}$ for different portions of the activity pattern has multiple distributions of probabilities that the supply voltage $V_{supply}$ is approximately at particular values during corresponding portions of the activity pattern. The solid curve connecting distributions represents an approximate average value of the supply voltage $V_{supply}$ as a function of time within the activity pattern. The modulation of this voltage is caused by pattern induced noise. The width of the distributions are a measure for non-pattern correlated noise.

Controller 130 and/or integrated circuit 200 for one embodiment may comprise any suitable logic to help repeatedly perform a predetermined pattern of activity on integrated circuit 200. Controller 130 for one embodiment may comprise any suitable logic to cause integrated circuit 200 to repeatedly perform a set of any suitable instructions.

Controller 130 and/or integrated circuit 200 for one embodiment may comprise any suitable logic to help selectively enable one or more components of logic 120 to measure a characteristic relating to a supply voltage $V_{supply}$ during a desired portion of a predetermined pattern of activity. Controller 130 and/or integrated circuit 200 for one embodiment may comprise any suitable logic to enable one or more components of logic 120 in accordance with a deterministic pattern aligned in time with one or more performances of a predetermined pattern of activity. Controller 130 and/or integrated circuit 200 for one embodiment may comprise any suitable logic to enable one or more components of logic 120 in response to any suitable one or more events, including hardware events for example. Integrated circuit 200 for one embodiment may comprise an on-die clock shrink (ODCS) that may be selectively controlled to align clock shrink events with one or more performances of a predetermined pattern of activity to help trigger enabling and/or disabling one or more components of logic 120 for a desired portion of the predetermined pattern of activity.

EXAMPLE SYSTEM

Figure 9:
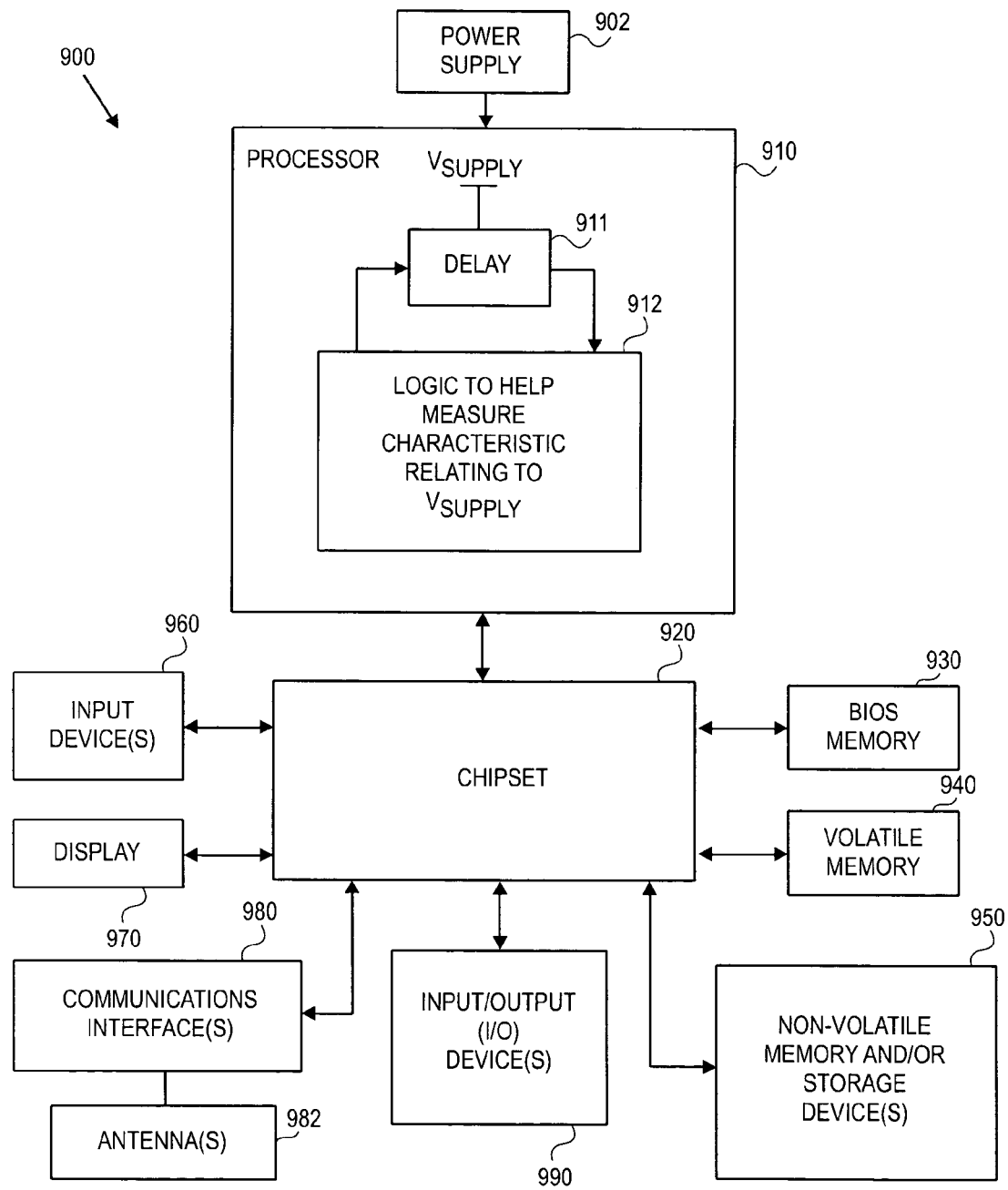
FIG. 9 illustrates, for one embodiment, a block diagram of an example system comprising a processor having logic to help measure a characteristic relating to a supply voltage based at least in part on supply voltage dependent delayed signals.

Integrated circuit 200 of FIG. 2 may be designed for use in any suitable system. Integrated circuit 200 for one embodiment may be designed to form at least a portion of a processor 910 for use in a system 900 as illustrated in FIG. 9. That is, processor 910 may have a delay 911 coupled to receive a supply voltage $V_{supply}$ and may have logic 912 to help measure a characteristic relating to the supply voltage $V_{supply}$. Delay 911 and logic 912 for one embodiment may correspond to delay 110 and at least a portion of logic 120. Processor 910 for one embodiment may also have at least a portion of a controller to measure the characteristic relating to the supply voltage $V_{supply}$. Such a controller for one embodiment may correspond to controller 130.

Processor 910 for one embodiment may be coupled to receive power from a power supply 902 to generate the supply voltage $V_{supply}$. Power supply 902 for one embodiment may correspond to power supply 202 of FIG. 2.

System 900 for one embodiment may also comprise a chipset 920 coupled to processor 910, a basic input/output system (BIOS) memory 930 coupled to chipset 920, volatile memory 940 coupled to chipset 920, non-volatile memory and/or storage device(s) 950 coupled to chipset 920, one or more input devices 960 coupled to chipset 920, a display 970 coupled to chipset 920, one or more communications interfaces 980 coupled to chipset 920, and/or one or more other input/output (I/O) devices 990 coupled to chipset 920.

Chipset 920 for one embodiment may comprise any suitable interface controllers to provide for any suitable communications link to processor 910 and/or to any suitable device or component in communication with chipset 920.

Chipset 920 for one embodiment may comprise a firmware controller to provide an interface to BIOS memory 930. BIOS memory 930 may be used to store any suitable system and/or video BIOS software for system 900. BIOS memory 930 may comprise any suitable non-volatile memory, such as a suitable flash memory for example. BIOS memory 930 for one embodiment may alternatively be included in chipset 920.

Chipset 920 for one embodiment may comprise one or more memory controllers to provide an interface to volatile memory 940. Volatile memory 940 may be used to load and store data and/or instructions, for example, for system 900. Volatile memory 940 may comprise any suitable volatile memory, such as suitable dynamic random access memory (DRAM) for example.

Chipset 920 for one embodiment may comprise a graphics controller to provide an interface to display 970. Display 970 may comprise any suitable display, such as a cathode ray tube (CRT) or a liquid crystal display (LCD) for example. The graphics controller for one embodiment may alternatively be external to chipset 920.

Chipset 920 for one embodiment may comprise one or more input/output (I/O) controllers to provide an interface to non-volatile memory and/or storage device(s) 950, input device(s) 960, communications interface(s) 980, and/or I/O devices 990.

Non-volatile memory and/or storage device(s) 950 may be used to store data and/or instructions, for example. Non-volatile memory and/or storage device(s) 950 may comprise any suitable non-volatile memory, such as flash memory for example, and/or may comprise any suitable non-volatile storage device(s), such as one or more hard disk drives (HDDs), one or more compact disc (CD) drives, and/or one or more digital versatile disc (DVD) drives for example.

Input device(s) 960 may comprise any suitable input device(s), such as a keyboard, a mouse, and/or any other suitable cursor control device.

Communications interface(s) 980 may provide an interface for system 900 to communicate over one or more networks and/or with any other suitable device. Communications interface(s) 980 may comprise any suitable hardware and/or firmware. Communications interface(s) 980 for one embodiment may comprise, for example, a network adapter, a wireless network adapter, a telephone modem, and/or a wireless modem. For wireless communications, communications interface(s) 980 for one embodiment may use one or more antennas 982.

I/O device(s) 990 may comprise any suitable I/O device(s) such as, for example, an audio device to help convert sound into corresponding digital signals and/or to help convert digital signals into corresponding sound, a camera, a camcorder, a printer, and/or a scanner.

Although described as residing in chipset 920, one or more controllers of chipset 920 may be integrated with processor 910, allowing processor 910 to communicate with one or more devices or components directly. As one example, one or more memory controllers for one embodiment may be integrated with processor 910, allowing processor 910 to communicate with volatile memory 940 directly.

In the foregoing description, example embodiments have been described. Various modifications and changes may be made to such embodiments without departing from the scope of the appended claims. The description and drawings are, accordingly, to be regarded in an illustrative rather than a restrictive sense.

What is claimed is:

1. An apparatus comprising:
    a first delay to receive a generated pulse to produce a first delayed pulse, the first delay to delay the generated pulse for an amount of time at least partially dependent on a supply voltage to produce the first delayed pulse;
    a second delay to receive the generated pulse when the first delay receives the generated pulse, the second delay to delay the generated pulse for a controllable amount of time to generate a second delayed pulse;
    a comparator to indicate which of the first and second delayed pulses arrives first at the comparator and to provide an indication thereof; and
    a counter to count the indication, wherein multiple pulses are to be generated for different controllable amounts of second delay time, the counter to provide a count of the indication for each amount of second delay time to a controller, the controller to determine probabilities that the first delay is in an interval of two second delay values for the different amounts of second delay time.

2. The apparatus of claim 1, wherein the first delay includes one or more buffers coupled to receive the supply voltage.

3. The apparatus of claim 1, wherein the comparator includes a phase detector.

4. The apparatus of claim 1, wherein the first delay, second delay, comparator and controller are on an integrated circuit.

5. The apparatus of claim 4, wherein the integrated circuit forms at least a portion of a processor.

6. The apparatus of claim 5, comprising a battery, wherein the integrated circuit is coupled to receive power from the battery.

* * * * *